United States Patent
Yang et al.

(10) Patent No.: US 11,859,923 B2
(45) Date of Patent: Jan. 2, 2024

(54) COOLING SYSTEM AND AUTOMATIC COOLANT-INJECTION METHOD FOR COOLING SYSTEM

(71) Applicant: Delta Electronics (Shanghai) Co., Ltd., Shanghai (CN)

(72) Inventors: Tao Yang, Shanghai (CN); Jun Chen, Shanghai (CN); Jingxian Kuang, Shanghai (CN); Dong Wang, Shanghai (CN); Shunxi Huang, Shanghai (CN); Qiquan Chen, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 72 days.

(21) Appl. No.: 17/455,660

(22) Filed: Nov. 18, 2021

(65) Prior Publication Data

US 2022/0178631 A1 Jun. 9, 2022

(30) Foreign Application Priority Data

Dec. 4, 2020 (CN) .......................... 202011409847.7

(51) Int. Cl.
*F28F 27/00* (2006.01)
*F28D 15/00* (2006.01)
(Continued)

(52) U.S. Cl.
CPC .............. *F28F 27/00* (2013.01); *F28D 15/00* (2013.01); *G05D 9/12* (2013.01); *F25B 45/00* (2013.01); *F28F 2250/08* (2013.01)

(58) Field of Classification Search
CPC ....... F28F 27/00; F28F 2250/08; F28D 15/00; G05D 9/12; F25B 45/00
See application file for complete search history.

(56) References Cited

U.S. PATENT DOCUMENTS 11,452,243 B2 * 9/2022 Lyon .................. H05K 7/20836
2019/0116694 A1 4/2019 Lyon et al.
(Continued)

FOREIGN PATENT DOCUMENTS

CN 103929016 A 7/2014
CN 108678911 A 10/2018
(Continued)

*Primary Examiner* — Tho V Duong
*Assistant Examiner* — Raheena R Malik
(74) *Attorney, Agent, or Firm* — CKC & Partners Co., LLC (57) ABSTRACT

The disclosure discloses a cooling system and an automatic coolant injection method for the cooling system. The cooling system includes a heat exchanger; a converter; a liquid cooling pipeline; a coolant tank with a liquid-level sensor; an injection pump for injecting coolant from the coolant tank into the liquid cooling pipe; and a control unit. When liquid level of the coolant tank reaches an upper threshold, the injection pump injects coolant into the liquid cooling pipeline. When pressure of the coolant in the liquid cooling pipe reaches an upper static liquid pressure threshold, the control unit turns off the injection pump, and executes the turning-on and turning-off operations of the circulation pump with a preset circulation period. The circulation pump forces the coolant to circulate in the liquid cooling pipeline when being turned on.

17 Claims, 4 Drawing Sheets

(51) Int. Cl.
*G05D 9/12* (2006.01)
*F25B 45/00* (2006.01)

(56) References Cited

U.S. PATENT DOCUMENTS

2021/0243921 A1\* 8/2021 Omote ................. H01L 23/473
2022/0338392 A1\* 10/2022 Watanabe .......... H05K 7/20945

FOREIGN PATENT DOCUMENTS

| CN | 108736765 A | \* | 11/2018 | ............... H02P 1/16 |
| CN | 108736765 A | | 11/2018 | |
| CN | 209797470 U | | 12/2019 | |
| CN | 110662400 A | | 1/2020 | |
| WO | 2020084656 A1 | | 4/2020 | |

\* cited by examiner

COOLING SYSTEM AND AUTOMATIC COOLANT-INJECTION METHOD FOR COOLING SYSTEM

CROSS-REFERENCE TO RELATED APPLICATIONS

This non-provisional application claims priority under 35 U.S.C. § 119 (a) on Patent Application No. 202011409847.7 filed in P. R. China on Dec. 4, 2020, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the present invention described herein. All references listed, cited and/or discussed in this specification are incorporated herein by reference in their entireties and to the same extent as if each reference was individually incorporated by reference.

TECHNICAL FIELD

The present invention relates to the field of cooling of the converters, and particularly to a cooling system and an automatic coolant-injection method for the cooling system.

BACKGROUND OF THE INVENTION

Figure 1:
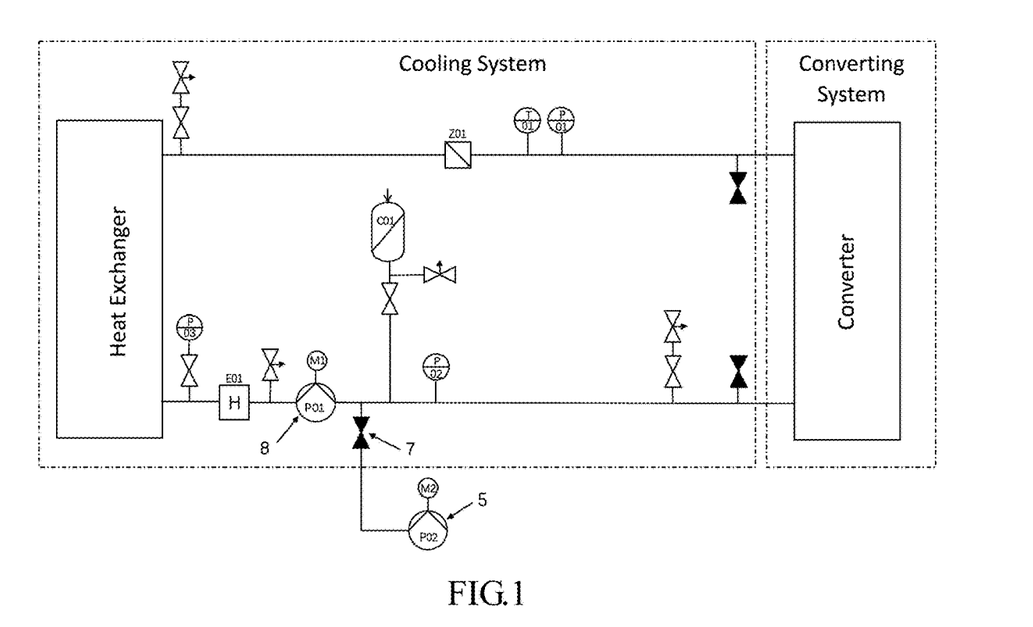
FIG. 1 is a structural diagram illustrating a conventional cooling system of a converter.

As shown in FIG. 1, an existing energy storage converter is typically equipped with a cooling system. The cooling system has coolant as heat-conducting medium. Before the cooling system works, appropriate amount of the coolant should be injected into a pipeline of the cooling system. During coolant injection, an external injection pump 5 is connected to the cooling system via a corresponding hose and a valve 7. Also, the injection pump 5 should be filled with the coolant in advance before it is in use. It is a complicated procedure, and may cause leakage of the coolant due to improper pump filling operation.

Due to the tortuous arrangement of the pipes in the cooling system of the converter, it is difficult to exhaust air in the pipes all at once during coolant injection. Excessive residual air in the pipes may cause reduction of heat dissipation efficiency of the cooling system. Therefore, during coolant injection, a circulation pump of the cooling system must be turned on and off repeatedly, allowing the air in the pipes to be gathered at a high location of the pipes when the circulation pump is turned off, and then exhausted via an exhaust valve disposed at this location. Thereby, the heat dissipation efficiency of the cooling system is ensured, and the normal operation of power elements of the converter is maintained. Generally, the exhaust process as described above needs a relatively long time. Furthermore, when the air in the pipes is exhausted, and the pressure of the coolant decreases, so that the cooling system needs to perform coolant-supplementing operation. Such operation process is tedious, and improper supplementing operation will probably result in a risk of the coolant flowing back and spraying out from the pipes of the cooling system, thereby affecting operations of other electrical devices on site.

In addition, during its normal operation, the cooling system also has loss of the coolant, and maintenance person is needed to be present to timely supplement the coolant. Otherwise, the pressure of the coolant within the pipes will decrease, causing the heat dissipation efficiency being reduced. The device thus alarms or operates at a reduced power. Moreover, in order to ensure safety, the device must be turned off during the coolant supplementing, which affects utilization ratio of the device, and increases maintenance cost.

Therefore, an problem needs urgently to be solved by those skilled in the art is to realize automatic injection of the cooling system of the energy storage converter so as to simplify the injection process, reduce maintenance cost, and thus improve heat dissipation efficiency of the cooling system and rate of utilization of the device.

SUMMARY OF THE INVENTION

According to one aspect of the invention, the present invention provides a cooling system, comprising a heat exchanger; a converter; a liquid cooling pipeline for connecting the heat exchanger with the converter, wherein the liquid cooling pipeline is provided with a circulation pump; a coolant tank for storing a coolant, wherein the coolant tank comprises a liquid level sensor for detecting a liquid level of the coolant tank; an injection pump connected to the coolant tank, for injecting the coolant from the coolant tank into the liquid cooling pipeline when the injection pump is turned on; and a control unit for controlling turning-on and turning-off operations of the injection pump and turning-on and turning-off operations of the circulation pump, and setting a dynamic hydraulic threshold and a static hydraulic threshold corresponding to respective states of the coolant in the liquid cooling pipeline. The control unit is configured to, when the liquid level of the coolant tank reaches an upper liquid level threshold, turn on the injection pump so that the coolant is injected into the liquid cooling pipeline by the injection pump; and when the pressure of the coolant in the liquid cooling pipeline reaches an upper static hydraulic threshold, turn off the injection pump, and execute the turning-on and turning-off operations of the circulation pump with a preset circulation period, wherein the circulation pump forces the coolant to circulate in the liquid cooling pipeline when being turned on.

According to another aspect of the invention, the present invention further provides an automatic coolant injection method for a cooling system, the cooling system comprising a heat exchanger, a converter, and a liquid cooling pipeline connecting the heat exchanger with the converter and provided with a circulation pump. Said method comprises providing a coolant tank and performing coolant adding operation for the coolant tank; disposing a liquid level sensor on the coolant tank for detecting a liquid level of the coolant tank; providing an injection pump connected to the coolant tank, for injecting coolant from the coolant tank into the liquid cooling pipeline when the injection pump is turned on; and providing a control unit for controlling turning-on and turning-off operations of the injection pump and turning-on and turning-off operations of the circulation pump, and setting a dynamic hydraulic threshold and a static hydraulic threshold corresponding to states of the coolant in the liquid cooling pipeline. The control unit is configured to, when the liquid level of the coolant tank reaches an upper liquid level threshold, turn on the injection pump so that the coolant is injected into the liquid cooling pipeline by the injection pump; and when a pressure of the coolant in the liquid cooling pipeline reaches an upper static hydraulic threshold, turn off the injection pump, and execute the turning-on and turning-off operations of the circulation pump with a preset circulation period, wherein the circulation pump forces the coolant to circulate in the liquid cooling pipeline when being turned on.

The cooling system in some embodiments of the present disclosure comprises the liquid coolant tank, the injection pump connected between the liquid coolant tank and the liquid cooling pipeline, and the control unit. During initial injection, the coolant is added into the coolant tank via an inlet port provided on the coolant tank, the coolant in which then automatically flows into the injection pump under action of gravity so as to automatically fill the pump. When the coolant in the coolant tank is increased to a certain level, the control unit turns on the injection pump to realize automatic injection of the liquid cooling pipeline, thus achieving simplifying injection process.

The control unit in some embodiments of the present disclosure sets thresholds of dynamic liquid pressure and thresholds of static liquid pressure, respectively, according to the states of the coolant in the liquid cooling pipeline. When the detected pressure of the coolant in the liquid cooling pipeline exceeds the corresponding set range, no matter the cooling system is in the on or off state, the control unit turns on the injection pump to automatically supplement the coolant to the liquid cooling pipeline, thereby shortening maintenance time, reducing manual maintenance, and also improving heat dissipation efficiency and utilization ratio of the device.

The cooling system in some embodiments of the present disclosure further comprises the first three-way valve and the second three-way valve. When the amount of the coolant in the coolant tank is reduced to a certain level, the control unit switches the first and second three-way valves to communicate an external coolant source, the injection pump, and the coolant tank, so as to achieve automatically supplementing the coolant to the coolant tank, which further reduces manual maintenance and maintenance cost.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

To make the above and other objects, features, advantages and examples of the invention more apparent, the accompanying drawings are explained as follows.

DETAILED EMBODIMENTS OF THE INVENTION

To make description of the invention more specific and complete, the accompanying drawings and various examples may be referred, and the same numbers in the drawings represent the same or similar components. On the other hand, the commonly known components and steps are not described in the examples to avoid unnecessary limit to the invention. In addition, for sake of simplifying the drawings, some known common structures and elements are illustrated in the drawings in a simple manner.

Figure 2:
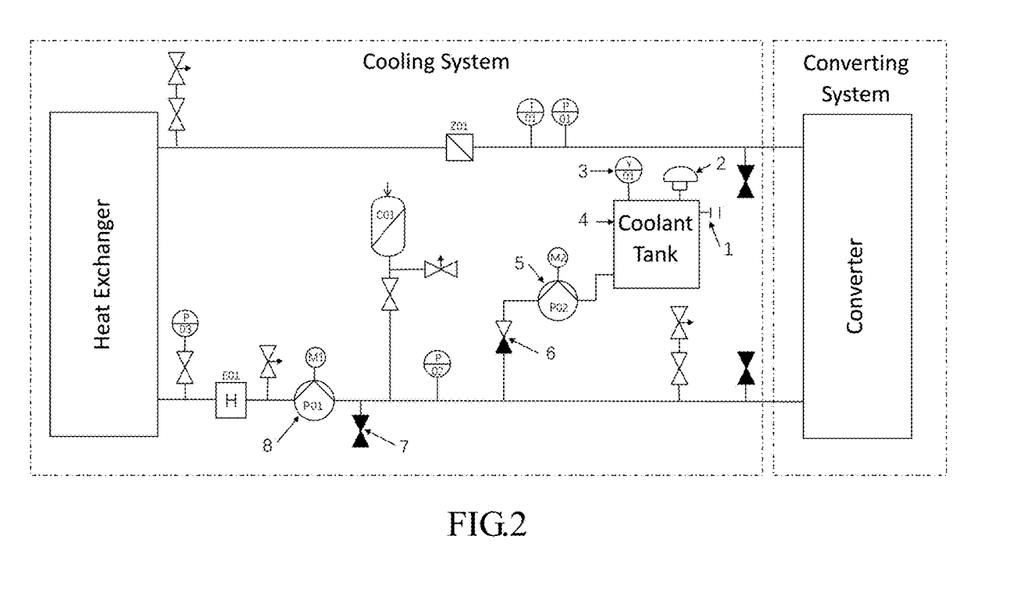
FIG. 2 is a structural diagram illustrating the cooling system according to a first embodiment of the invention.

As shown in FIG. 2, in the first embodiment of the present disclosure, a cooling system comprises a heat exchanger, a converter, and a liquid cooling pipeline connecting the heat exchanger with the converter. A circulation pump 8 is provided in the liquid cooling pipeline. The cooling system further comprises a coolant tank 4, an injection pump 5 and a control unit. The coolant tank 4 is used to store a coolant (such as a liquid coolant) and the coolant tank 4 is equipped with a liquid level sensor 3. The liquid level sensor 3 real-timely detects the liquid level of the coolant tank 4. The injection pump 5 is connected to the coolant tank 4 and used to inject the coolant from the coolant tank 4 into the liquid cooling pipeline during its operation. The control unit is used to turn on or turn off the injection pump 5, turn on or turn off the circulation pump 8, and set dynamic hydraulic threshold and static hydraulic threshold. The dynamic hydraulic threshold and the static hydraulic threshold correspond to the state of the coolant in the liquid cooling pipeline. When the coolant flows in the liquid cooling pipeline, the liquid pressure is enormously different from the coolant being static, the hydraulic thresholds of the liquid pressure are set respectively depending on operating conditions of the system. For example, when the liquid level in the coolant tank 4 reaches an upper liquid level threshold, the control unit is configured to turn on the injection pump 5 so that the coolant is injected into the liquid cooling pipeline by the injection pump 5. When the pressure of the coolant in the liquid cooling pipeline reaches an upper static hydraulic threshold, the control unit is configured to turn off the injection pump 5. Therefore, the circulation pump 8 are executed to turn on and turn off with a preset circulation period. And the circulation pump 8 forces the coolant to circulate in the liquid cooling pipeline when being turned on.

In some embodiments, the coolant-injection means of the cooling system may be integrated into the cooling system, and the injection operation is controlled by the control unit of the cooling system. The liquid level sensor 3 is provided to detect the liquid level of the coolant within the coolant tank 4, thereby determining whether the amount of the coolant in the coolant tank 4 satisfies the requirement for injection.

Further, a respiration valve 2 is disposed on the coolant tank 4 to communicate the coolant tank 4 with the external, maintaining the gas pressure in the coolant tank 4 in balance with environment, facilitating the adjustment of the liquid level, and also facilitating the injection pump 5 to draw the coolant from the coolant tank 4.

It can be understood that the respiration valve 2 communicates inside and outside of the coolant tank 4, such that the coolant in the coolant tank 4 can automatically flow into the injection pump 5 under action of gravity to complete the filling of the pump. Thus, the cooling system realizes an automatic filling of the injection pump in the initial coolant-injection, and then turns on the injection process according to judgement to the detected pressure in a cooling loop, thereby realizing the automatic injection of the cooling system.

Additionally and/or alternatively, in other embodiments, the coolant tank 4 is provided with an inlet port 1 for realizing coolant-adding operation to the coolant tank 4. It can be understood that the liquid cooling pipeline can be further provided with an exhaust valve.

Additionally and/or alternatively, in other embodiments, a unidirectional valve 6 is provided between the injection pump 5 and the liquid cooling pipeline for preventing the coolant in the liquid cooling pipeline from flowing back into the coolant tank 4.

According to a further embodiment of the invention, in order to timely supplement the coolant consumed during normal operation of the device, the cooling system is further configured to realize automatic coolant-supplementing function. The pressure of the coolant in the system is real-timely monitored. Once the monitored pressure is less than a preset value under the current operation state, the injection pump can be timely turned on to supplement the coolant. Thereby, the heat dissipation efficiency of the cooling system is improved, and the manual maintenance can be reduced. In addition, since no need of the turning-off operation, the utilization of the device is thus improved.

In particular, the control unit is configured to, when the circulation pump 8 is turned on (i.e., the coolant in the liquid cooling pipeline is in the flow state), turn on the injection pump 5 when the pressure of the coolant in the liquid cooling pipeline is less than a lower dynamic hydraulic threshold so as to supplement the coolant to the liquid cooling pipe, allowing the pressure of the coolant to be continuously increased, and turn off the injection pump 5 when the pressure of the coolant reaches an upper dynamic hydraulic threshold.

Furthermore, the control unit is configured to, when the circulation pump 8 is turned off (i.e., the coolant in the liquid cooling pipeline is in a static state), turn on the injection pump 5 when the pressure of the coolant in the liquid cooling pipeline is less than a lower static hydraulic threshold so as to supplement the coolant to the liquid cooling pipeline, allowing the pressure of the coolant to be continuously increased; and turn off the injection pump 5 when the pressure of the coolant reaches an upper static hydraulic threshold.

Additionally and/or alternatively, in other embodiments, the cooling system comprises a temperature sensor. The temperature sensor is disposed on the liquid cooling pipeline and used to monitor temperature of the coolant at a inlet end of the converter, and output a temperature detection signal to the control unit. When the circulation pump 8 is turned on, the control unit is configured to turn on the injection pump 5, and when the temperature of the coolant reaches the upper operating temperature threshold, and the pressure of the coolant is less than the upper dynamic hydraulic threshold, so as to supplement the coolant to the liquid cooling pipeline to allow the pressure of the coolant to be continuously increased. When the pressure of the coolant reaches the upper dynamic hydraulic threshold, the control unit is configured to turn off the injection pump 5 so that the heat dissipation capability of the cooling system can be quickly improved.

It can be understood that, during the coolant-supplementing of the cooling system, firstly, the operation state of the cooling system is judged, and then thresholds for coolant-injection of the cooling system are set depending on different operation states, thereby realizing optimum control to the pressure of the cooling system.

Figure 3:
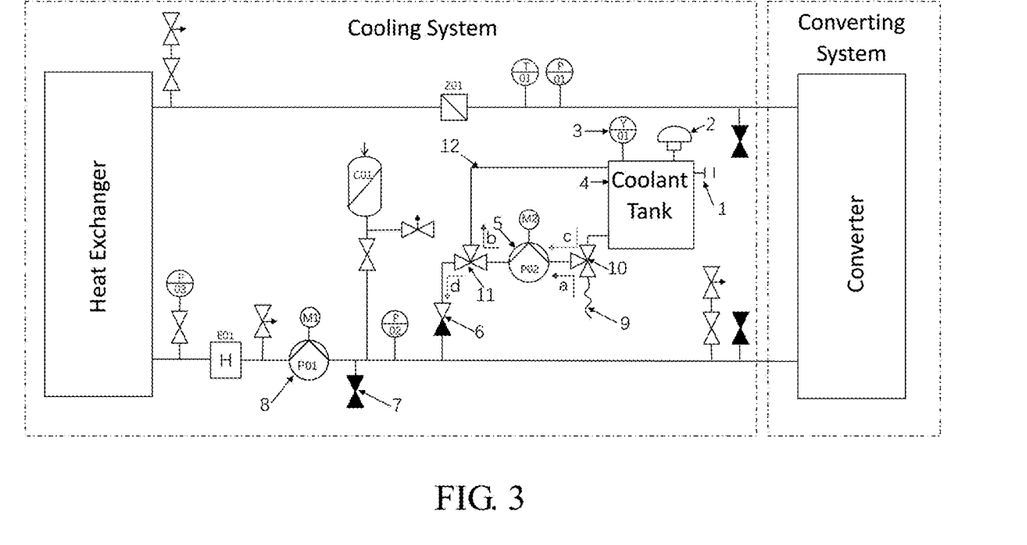
FIG. 3 is a structural diagram illustrating the cooling system according to a second embodiment of the invention.

According to still another embodiment of the invention, referring to FIG. 3, the cooling system further comprises a first three-way valve 10 having a first end, a second end and a third end, and a second three-way valve 11 having a first end, a second end and a third end. The first end of the first three-way valve 10 is connected to the coolant tank 4. The second end of the first three-way valve 10 is connected to the injection pump 5. The third end of the first three-way valve 10 is connected to an external coolant source. The first end of the second three-way valve 11 is connected to the injection pump 5. The second end of the second three-way valve 11 is connected to the liquid cooling pipeline. The third end of the second three-way valve 11 is connected to the coolant tank 4.

The control unit is configured to turn off the injection pump 5 and to add coolant to the coolant tank 4 when the liquid level of the coolant tank 4 is less than the lower liquid level threshold.

In detail, during the coolant-adding to the coolant tank 4 at the first time, the first three-way valve 10 and the second three-way valve 11 are switched to communicate the pipes c and b. Coolant is added into the coolant tank 4 via the inlet port 1, and then automatically flows into the injection pump 5 under action of gravity until there is coolant flowing back to the coolant tank 4 through a pipe 12. Thus, the coolant-injection operation for the injection pump 5 is completed.

Then, the automatic coolant-injection operation for the coolant tank 4 begins. A hose 9 is connected to an external coolant source. The control unit automatically switches the first three-way valve 10 to a pipe a. Subsequently, the injection pump 5 is turned on to transmit the coolant to the coolant tank 4 through the pipes a and b until the liquid level is higher than the upper liquid level threshold. Then, the injection pump 5 is turned off, and the first three-way valve 10 and the second three-way valve 11 are switched to communicate the pipes c and b. Thus, the automatic coolant-adding operation for the coolant tank 4 is completed.

It can be understood that the subsequent coolant-adding operation does not need the coolant-injection operation for the injection pump 5 anymore. The automatic coolant-adding operation for the coolant tank 4 can be performed directly through the hose 9. When the first/initial coolant-adding operation for the coolant tank is completed, the coolant-injection operation and/or coolant-supplementing operation to the cooling system can be controlled automatically. Therefore, the three-way valves are used to switch the pipeline for coolant-injection operation and the pipeline for coolant-supplementing operation, thereby realizing automatic coolant-adding to the coolant tank, and apparently reducing manual participation.

According to another embodiment of the present invention, an automatic coolant-injection method for a cooling system is provided. The cooling system comprises a heat exchanger, a converter, and a liquid cooling pipeline connecting the heat exchanger with the converter and provided with a circulation pump 8. The automatic coolant-injection method can be realized by the following steps:

providing a coolant tank 4 and perform coolant-adding operation to the coolant tank 4;

providing a liquid level sensor 3 on the coolant tank 4 for real-time detecting a liquid level of the coolant tank 4;

providing an injection pump 5 connected to the coolant tank 4 for injecting coolant from the coolant tank 4 into the liquid cooling pipeline when the injection pump 5 is turned on; and providing a control unit for controlling turning-on and turning-off operations of the injection pump 5 and turning-on and turning-off operations of the circulation pump 8, and setting a dynamic hydraulic threshold and a static hydraulic threshold corresponding to states of the coolant in the liquid cooling pipeline.

In the above coolant-injection method, when the liquid level of the coolant tank 4 reaches an upper liquid level threshold, the control unit is configured to turn on the injection pump 5, allowing the coolant to be injected into the liquid cooling pipeline through the injection pump 5. When a pressure of the coolant in the liquid cooling pipeline reaches an upper static hydraulic threshold, the control unit is configured to turn off the injection pump 5 so as to execute the turning-on and turning-off operations of the circulation pump 8 with a preset circulation period. The circulation pump 8 forces the coolant to circulate in the liquid cooling pipeline when being turned on.

Figure 4:
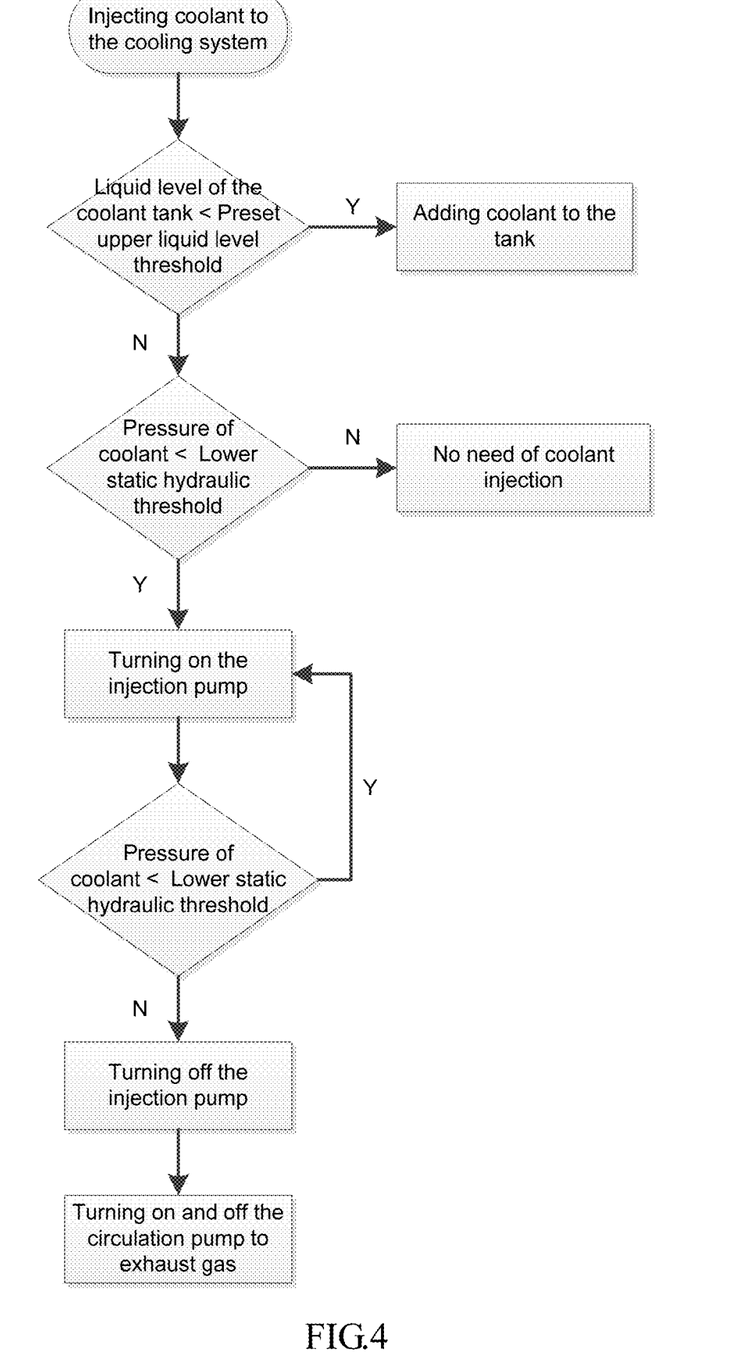
FIG. 4 is a flow diagram illustrating the automatic coolant-injection method for a cooling system according to one embodiment of the invention.

Referring to FIG. 4, the flow diagram illustratively shows the coolant-injection operation for the cooling system. The coolant tank 4 is added with coolant, and the liquid level sensor 3 detects the liquid level of the coolant tank 4. When the liquid level of the coolant tank 4 reaches a preset upper liquid level threshold and the pressure of the coolant is less than a lower static hydraulic threshold, the injection pump 5 is turned on to perform coolant-injection. When the pressure of the coolant reaches an upper static hydraulic threshold, the injection pump 5 is turned off. Then, the circulation pump 8 operates according to a preset on-off cycle to exhaust gas/air from the pipeline.

It can be understood that the coolant-injection operation is a preparation work before the initial use of the device. At this time, the pressure of the coolant in the pipeline of the cooling system is typically far less than the lower static hydraulic threshold. Therefore, when the liquid level of the coolant tank 4 reaches the upper liquid level threshold, the determining whether the pressure of the coolant is less than the lower static hydraulic threshold can be omitted depending on situation, and the injection pump can be directly turned on for injecting coolant.

Optionally, when the liquid level of the coolant tank 4 is less than a lower liquid level threshold, the injection pump 5 is turned off and a low liquid level alarm can be sent, and adding coolant to the coolant tank 4.

In order to timely supplementing the coolant consumed during normal operation of the device, the cooling system still further provides coolant-supplementing operation. When the circulation pump 8 is turned on, the control unit is configured to turn on the injection pump 5 when the pressure of the coolant in the liquid cooling pipeline is less than a lower dynamic hydraulic threshold so as to supplement the coolant to the liquid cooling pipeline, the pressure of the coolant continuously increases. When the pressure of the coolant reaches an upper dynamic hydraulic threshold, the control unit is configured to turn off the injection pump 5.

Furthermore, when the circulation pump 8 is turned off, the control unit is configured to turn on the injection pump 5 when the pressure of the coolant in the liquid cooling pipeline is less than the lower static hydraulic threshold so as to supplement coolant to the liquid cooling pipeline. The pressure of the coolant continuously increases. When the pressure of the coolant reaches the upper static hydraulic threshold, the control unit is configured to turn off the injection pump 5.

Figure 5:
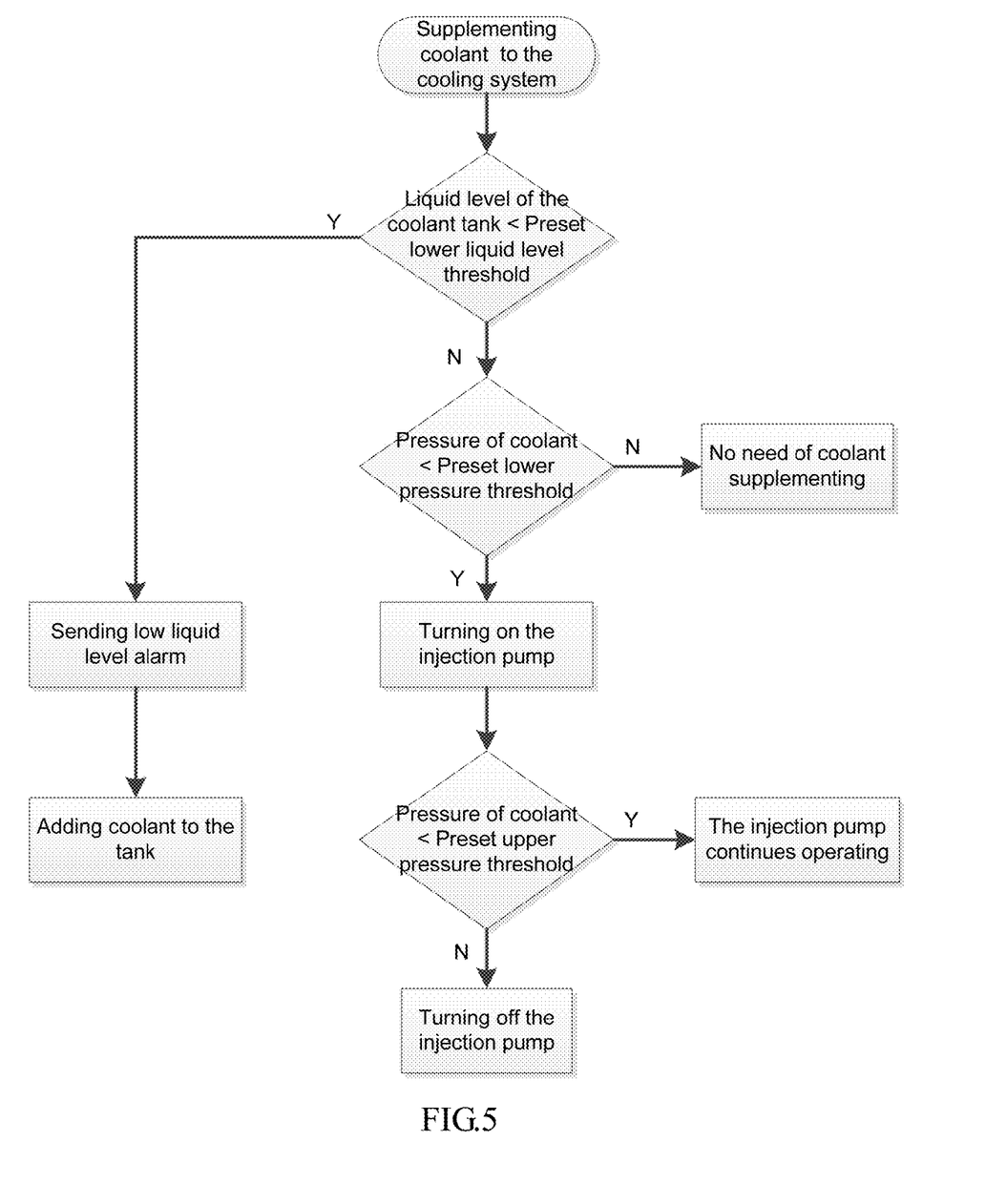
FIG. 5 is a flow diagram of the automatic coolant-supplementing method for a cooling system according to one embodiment of the invention.

Referring to FIG. 5, the flow diagram illustratively shows coolant supplementing operation of the cooling system. When the liquid level of the coolant tank 4 is greater than the lower liquid level threshold and the pressure of the coolant is less than a preset lower pressure threshold at the current operating state, the injection pump is turned on. When the pressure of the coolant reaches a preset upper pressure threshold at the current operating state, the injection pump is turned off. When the liquid level of the coolant tank 4 is less than the lower liquid level threshold, the low liquid level alarm is sent and the coolant tank 4 is added with coolant.

Furthermore, the cooling system further comprises a temperature sensor. The temperature sensor is disposed on the liquid cooling pipeline. The temperature sensor monitors the temperature of the coolant at an inlet end of the converter, and outputs a temperature detection signal to the control unit. In the automatic coolant-injection method, when the circulation pump 8 is turned on, the control unit is configured to turn on the injection pump 5 when the temperature of the coolant reaches an upper operating temperature threshold and the pressure of the coolant is less than the upper dynamic hydraulic threshold, so as to supplement the coolant to the liquid cooling pipeline. The pressure of the coolant continuously increases. When the pressure of the coolant reaches the upper dynamic hydraulic threshold, the control unit is configured to turn off the injection pump 5.

In some embodiments, the control unit determines the upper and lower dynamic hydraulic thresholds and the upper and lower static hydraulic thresholds according to the operating states of the circulation pump, thereby ensuring the pressure of the pipeline within a normal demand range. When the device is in normal operation, the control unit real-timely monitors the temperature of the coolant in the pipeline, for example, by use of one or more temperature sensors. When the temperature is close to a derated operating temperature of the device, the coolant-supplementing operation is performed to make the pipeline pressure to the maximum upper threshold, thereby improving heat dissipation capability of the cooling system, and ensuring full power operation of the device. Moreover, when the temperature of the coolant is in a normal range, the upper dynamic hydraulic threshold can be set depending on different temperature ranges. The coolant supplementing operation can be performed in either the turning-on or turning-off state of the device.

Additionally or alternatively, in some embodiments, in the automatic injection method, when the circulation pump 8 is turned on, the cooling system gathers the gas in the liquid cooling pipeline along with circulation of the coolant. When the circulation pump 8 is turned off, the cooling system exhausts the gathered gas via an exhaust valve. The exhaust valve may be disposed on the liquid cooling pipeline.

According to another embodiment of the invention, an automatic coolant adding method for the coolant tank 4 is provided. Illustratively, the coolant adding operation for the coolant tank 4 further comprises the steps of:

switching the first three-way valve 10 and the second three-way valve 11 by the control unit, to form a fluid loop including the coolant tank 4, the first three-way valve 10, the injection pump 5, the second three-way valve 11, and the coolant tank 4 in sequence;

adding coolant via the inlet port 1 disposed on the coolant tank 4; and     allowing the coolant in the coolant tank 4 to automatically flow into the injection pump 5 via the first three-way valve 10 under action of gravity until the coolant flows back to the coolant tank 4 to complete filling of the injection pump 5.

Additionally and/or Alternatively, the control unit is configured to turn off the injection pump 5 when the liquid level of the coolant tank 4 is less than the lower liquid level threshold, so as to automatically add coolant to the coolant tank 4.

Further, the control unit switches the first three-way valve 10 and the second three-way valve 11, and thus forms a fluid loop. The fluid loop sequentially includes an external coolant source, the first three-way valve 10, the injection pump 5, the second three-way valve 11, and the coolant tank 4. The control unit is configured to turn on the injection pump 5 to automatically add coolant to the coolant tank 4. When the liquid level of the coolant tank 4 reaches the upper liquid level threshold, the automatic coolant adding operation for the coolant tank 4 is completed. The control unit is then configured to turn off the injection pump 5 and to switch the first three-way valve 10 and the second three-way valve 11 to form a fluid loop. The fluid loop includes the coolant tank 4, the first three-way valve 10, the injection pump 5, the second three-way valve 11, and the liquid cooling pipeline in sequence.

Based on the above, the present disclosure realizes automatic coolant-injection for the pipeline of the cooling system before use, under the mutual cooperation between the liquid level sensor 3, the injection pump 5, the circulation pump 8, and the control unit. In addition, the present disclosure also realizes automatic coolant injection function for the cooling system and automatic coolant adding function for the coolant tank 4 by communicating the coolant tank 4, the injection pump 5, the liquid cooling pipeline, and the external coolant source through the first three-way valve 10 and the second three-way valve 11.

Although the embodiments of the invention have been disclosed, they are not to limit the invention. Any skilled in the art shall make various variations and modifications without departing from spirit and scope of the invention, so the protection scope of the invention shall be subjected to the scope defined by the appended claims.

What is claimed is:

1. A cooling system, comprising:
   a heat exchanger;
   a converter;
   a liquid cooling pipeline for connecting the heat exchanger with the converter, wherein the liquid cooling pipeline is provided with a circulation pump;
   a coolant tank for storing a coolant, wherein the coolant tank comprises a liquid level sensor for detecting a liquid level of the coolant tank;
   an injection pump connected to the coolant tank, for injecting the coolant from the coolant tank into the liquid cooling pipeline when the injection pump is turned on; and
   a control unit for controlling turning-on and turning-off operations of the injection pump and turning-on and turning-off operations of the circulation pump, and setting a dynamic hydraulic threshold and a static hydraulic threshold corresponding to respective states of the coolant in the liquid cooling pipeline,
   wherein the control unit is configured to,
   when the liquid level of the coolant tank reaches an upper liquid level threshold, turn on the injection pump so that the coolant is injected into the liquid cooling pipeline by the injection pump; and
   when the pressure of the coolant in the liquid cooling pipeline reaches an upper static hydraulic threshold, turn off the injection pump, and execute the turning-on and turning-off operations of the circulation pump with a preset circulation period, wherein the circulation pump forces the coolant to circulate in the liquid cooling pipeline when being turned on,
   wherein the coolant tank is further provided with a respiration valve for communicating inside and outside of the coolant tank, allowing the coolant in the coolant tank to automatically flow into the injection pump.

2. The cooling system according to claim 1, wherein the coolant tank is further provided with an inlet port for performing coolant adding operation for the coolant tank.

3. The cooling system according to claim 1, wherein the cooling system further comprises:
   a first three-way valve having a first end connected to the coolant tank, a second end connected to the injection pump, and a third end connected to an external coolant source; and
   a second three-way valve having a first end connected to the injection pump, a second end connected to the liquid cooling pipeline, and a third end connected to the coolant tank.

4. The cooling system according to claim 1, wherein the control unit is configured to, when the circulation pump is turned on,
   turn on the injection pump when the pressure of the coolant in the liquid cooling pipeline is less than a lower dynamic hydraulic threshold, so as to supplement coolant to the liquid cooling pipeline to continuously increase the pressure of the coolant, and
   turn off the injection pump when the pressure of the coolant reaches an upper dynamic hydraulic threshold.

5. The cooling system according to claim 1, wherein the control unit is configured to, when the circulation pump is turned off,
   turn on the injection pump when the pressure of the coolant in the liquid cooling pipeline is less than a lower static hydraulic threshold, so as to supplement liquid to the liquid cooling pipeline to continuously increase the pressure of the coolant, and
   turn off the injection pump when the pressure of the coolant reaches the upper static hydraulic threshold.

6. The cooling system according to claim 1, further comprising a temperature sensor disposed on the liquid cooling pipeline, wherein the temperature sensor monitors a temperature of the coolant at an inlet end of the converter and outputs a temperature detection signal to the control unit,
   wherein the control unit is configured to, when the circulation pump is turned on,
   turn on the injection pump when the temperature of the coolant reaches an upper operating temperature threshold and the pressure of the coolant is less than an upper dynamic hydraulic threshold, so as to supplement coolant to the liquid cooling pipeline to continuously increase the pressure of the coolant, and
   turn off the injection pump when the pressure of the coolant reaches the upper dynamic hydraulic threshold.

7. The cooling system according to claim 1, wherein the control unit is configured to turn off the injection pump and add coolant to the coolant tank, when the liquid level of the coolant tank is less than a lower liquid level threshold.

8. The cooling system according to claim 1, wherein the cooling system further comprises a unidirectional valve connected between the injection pump and the liquid cooling pipeline, for preventing the coolant in the liquid cooling pipeline from flowing back to the coolant tank.

9. The cooling system according to claim 1, wherein the liquid cooling pipeline is further provided with an exhaust valve.

10. An automatic coolant injection method for a cooling system, the cooling system comprising a heat exchanger, a converter, and a liquid cooling pipeline connecting the heat exchanger with the converter and provided with a circulation pump, said method comprising:

providing a coolant tank and performing coolant adding operation for the coolant tank;

disposing a liquid level sensor on the coolant tank for detecting a liquid level of the coolant tank;

providing an injection pump connected to the coolant tank, for injecting coolant from the coolant tank into the liquid cooling pipeline when the injection pump is turned on; and providing a control unit for controlling turning-on and turning-off operations of the injection pump and turning-on and turning-off operations of the circulation pump, and setting a dynamic hydraulic threshold and a static hydraulic threshold corresponding to states of the coolant in the liquid cooling pipeline, wherein the control unit is configured to, when the liquid level of the coolant tank reaches an upper liquid level threshold, turn on the injection pump so that the coolant is injected into the liquid cooling pipeline by the injection pump; and when a pressure of the coolant in the liquid cooling pipeline reaches an upper static hydraulic threshold, turn off the injection pump, and execute the turning-on and turning-off operations of the circulation pump with a preset circulation period, wherein the circulation pump forces the coolant to circulate in the liquid cooling pipeline when being turned on, wherein the coolant tank is further provided with a respiration valve for communicating inside and outside of the coolant tank, allowing the coolant in the coolant tank to automatically flow into the injection pump.

11. The method according to claim 10, wherein the cooling system further comprises a first three-way valve and a second three-way valve, and the step of performing coolant adding operation for the coolant tank comprising:

switching the first three-way valve and the second three-way valve by the control unit, and forming a fluid loop including the coolant tank, the first three-way valve, the injection pump, the second three-way valve, and the coolant tank in sequence;

adding the coolant into the coolant tank via an inlet port disposed on the coolant tank; and allowing the coolant in the coolant tank to automatically flow into the injection pump via the first three-way valve until the coolant flows back to the coolant tank to complete filling of the injection pump.

12. The method according to claim 10, wherein the cooling system further comprises a first three-way valve and a second three-way valve, and the step of performing coolant adding operation for the coolant tank comprising:

switching the first three-way valve and the second three-way valve by the control unit, and forming a fluid loop including an external coolant source, the first three-way valve, the injection pump, the second three-way valve, and the coolant tank in sequence; and turning on the injection pump to automatically add coolant to the coolant tank until the liquid level of the coolant tank reaches the upper liquid level threshold, wherein the control unit is configured to then turn off the injection pump, and switch the first three-way valve and the second three-way valve to form a fluid loop including the coolant tank, the first three-way valve, the injection pump, the second three-way valve, and the liquid cooling pipeline in sequence.

13. The method according to claim 10, further comprising:

configuring the control unit to turn off the injection pump and automatically add coolant to the coolant tank when the liquid level of the coolant tank is less than a lower liquid level threshold.

14. The method according to claim 10, further comprising:

configuring the control unit to, when the circulation pump is turned on, turn on the injection pump when the pressure of the coolant in the liquid cooling pipeline is less than a lower dynamic hydraulic threshold, so as to supplement coolant to the liquid cooling pipeline to continuously increase the pressure of the coolant, and turn off the injection pump when the pressure of the coolant reaches an upper dynamic hydraulic threshold.

15. The method according to claim 10, further comprising:

configuring the control unit to, when the circulation pump is turned off, turn on the injection pump when the pressure of the coolant in the liquid cooling pipeline is less than a lower static hydraulic threshold, so as to supplement coolant to the liquid cooling pipeline to continuously increase the pressure of the coolant, and turn off the injection pump when the pressure of the coolant reaches the upper static hydraulic threshold.

16. The method according to claim 10, wherein the cooling system further comprises a temperature sensor disposed on the liquid cooling pipeline for monitoring a temperature of the coolant at an inlet end of the converter and outputting a temperature detection signal to the control unit; and wherein when the circulation pump is turned on, the control unit is configured to:

turn on the injection pump when the temperature of the coolant reaches an upper operating temperature threshold and the pressure of the coolant is less than an upper dynamic hydraulic threshold, so as to supplement coolant to the liquid cooling pipeline to continuously increase the pressure of the coolant, and turn off the injection pump when the pressure of the coolant reaches the upper dynamic hydraulic threshold.

17. The method according to claim 10, further comprising when the circulation pump is turned on, gathering gas in the liquid cooling pipeline along with circulation of the coolant; and when the circulation pump is turned off, exhausting the gas gathered together via an exhaust valve disposed on the liquid cooling pipeline.

* * * * *